United States Patent
Jalaleddine

(10) Patent No.: US 8,847,676 B2
(45) Date of Patent: Sep. 30, 2014

(54) IMAGE REJECTION FOR LOW IF RECEIVERS

(75) Inventor: Sateh Jalaleddine, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/533,501

(22) Filed: Jun. 26, 2012

(65) Prior Publication Data

US 2013/0342267 A1 Dec. 26, 2013

(51) Int. Cl.
*H03B 1/00* (2006.01)

(52) U.S. Cl.
USPC .......................................................... 327/553

(58) Field of Classification Search
CPC ............................ H03H 11/0422; H03H 11/20
USPC .......... 327/551, 552, 553, 556, 557, 558, 559
See application file for complete search history.

(56) References Cited

U.S. PATENT DOCUMENTS

| 7,587,010 B2 * | 9/2009 | Morie et al. ................... 375/350 |
| 8,463,219 B2 * | 6/2013 | Kavadias ....................... 455/260 |
| 2011/0086605 A1 | 4/2011 | Chanca et al. |

OTHER PUBLICATIONS

Jan Crols & Michiel S.J. Steyaert, Low-IF Topologies for High-Performance Analog Front End of Fully Integrated Receivers; IEEE Transactions on Circuits and Systems II; Analog & Digital Processing, vol. 45, No. 3 Mar. 1998, pp. 269-282.

* cited by examiner

*Primary Examiner* — Jeffrey Zweizig

(57) ABSTRACT

A system that includes a polyphase filter comprises first and second gm-C filters with first and second variable biasing and a bias controller coupled to the first and second gm-C filters and configured to offset the first variable biasing and corresponding first gm of the first gm-C filter relative to the second variable biasing and corresponding second gm of the second gm-C filter to thus improve image rejection in the system. A corresponding method includes processing a signal in a complex polyphase filter and controlling biasing of the first gm-C filter stage relative to the second gm-C filter stage to provide a mismatched gm and thereby improve rejection of the image signal.

20 Claims, 6 Drawing Sheets

IMAGE REJECTION FOR LOW IF RECEIVERS

FIELD OF THE INVENTION

This invention relates in general to receivers and more specifically filtering for receivers including apparatus and techniques for calibrating such filters.

BACKGROUND OF THE INVENTION

Receivers are known. More and more pressure is being exerted to move toward higher levels of integration of receivers particularly in markets where size and costs are especially sensitive. Receivers that operate with a low (not zero) Intermediate Frequency (IF) architecture tend to lend themselves to high levels of integration and low battery power requirements. In low IF architectures, most signal processing is done at relatively low frequencies and this usually means lower battery drain levels. By avoiding zero IF frequencies disturbances due to direct current (DC) offsets and 1/f noise are avoided. By using low IF frequencies, expensive and usually physically large high frequency multistate bandpass filtering is avoided. Other techniques using complicated mixer arrangements can avoid imbalances due to process variables, but at the cost of large battery drain levels. These low IF architectures are especially sensitive to image signal levels or image rejection ratios, since the image signals are near if not within the desired signal bandwidths.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

In overview, the present disclosure concerns systems and procedures for improved image rejection in receivers or systems related to receivers. More specifically techniques and apparatus for offsetting or mismatching transconductance (Gm or gm) cells, such as those found in various polyphase filters are discussed. These techniques and apparatus include various inventive concepts and principles that can be utilized, arranged, and constructed for enhanced or improved image signal rejection in applications, such as low intermediate frequency (IF) systems, where that may be needed.

The products and markets of particular interest may vary widely but include the low cost, low power, high density applications such as the markets commonly referred to as Blue Tooth, ZIGBEE, and the like. In systems, equipment and devices that employ low IF systems and receivers, e.g., Blue Tooth, derivatives and the like, image rejection improvement apparatus and methods can be particularly advantageously utilized, provided they are practiced in accordance with the inventive concepts and principles as taught herein.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in integrated circuits (ICs) including possibly application specific ICs or ICs with integrated processing controlled by embedded software or firmware. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore, in the interest of brevity and minimization of any risk of obscuring the principles and concepts according to the present invention, further discussion of such software and ICs, if any, will be limited to the essentials with respect to the principles and concepts of the various embodiments.

Figure 1:
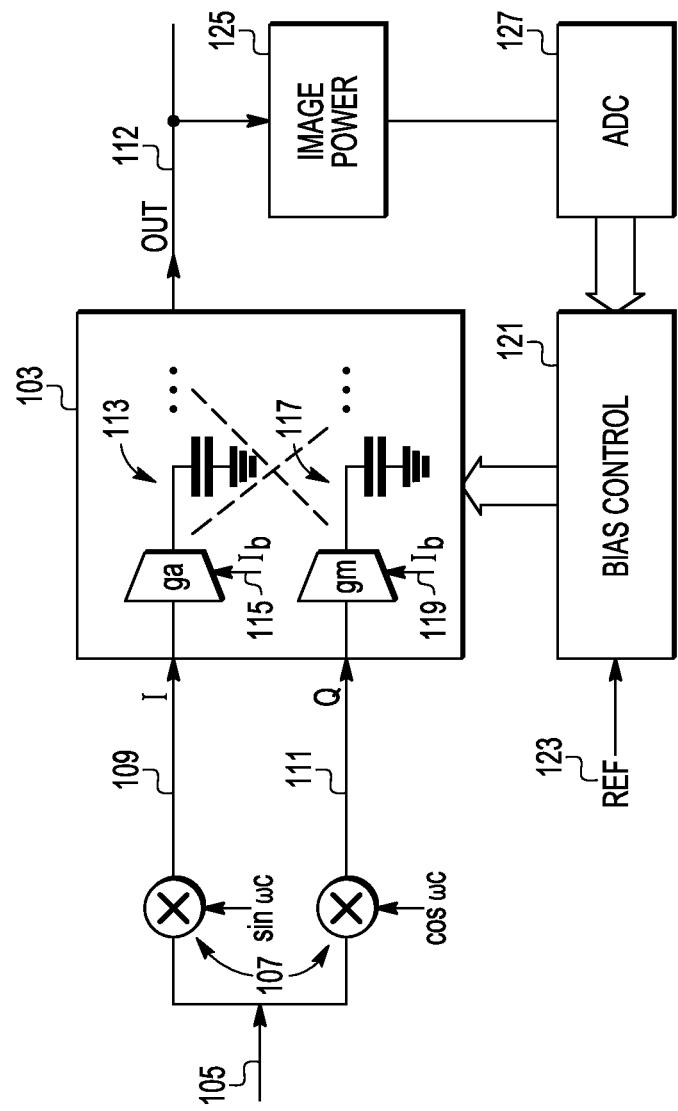
FIG. 1 depicts in a simplified and representative form, a high level diagram of a system with a polyphase filter suitable for use in a receiver in accordance with one or more embodiments.

Referring to FIG. 1, a simplified and representative high level diagram of a system with a polyphase filter suitable for use in a receiver, etc. in accordance with one or more embodiments will be briefly discussed and described. In FIG. 1, a system 101 that includes among other features, a filter or more specifically a polyphase filter 103 is shown. This system can be a portion of a receiver arranged for receiving a radio frequency signal (at 105), such as a Blue Tooth or ZIGBEE signal as more or less defined in IEEE 802.15.1 and IEEE 802.15.4 or other similar radio signals. The BlueTooth or ZIGBEE signals have carrier frequencies in the range of 2.4 GHz with bandwidths of 1.0 MHz and 2.0 MHz, respectively. Usually the radio signal at 105 will be applied to a mixer 107. The mixer is often a complex mixer, such as a balanced mixer or quadrature mixer with local oscillators that are 90 degrees out of phase. The mixer generates an in phase (real or I) signal at 109 and a quadrature (imaginary or Q) signal at 111.

Various embodiments or aspects in accordance with the present invention, while broadly applicable, can be particularly useful in what is known as low intermediate frequency (low IF) systems or receivers. Low IF systems are generally less expensive, as most filtering and processing can be done at lower frequencies with lower powers and at higher levels of integration. In low IF systems, the IF frequency is low or small enough that the image frequency or image signal at the image frequency is in or nearly in band, i.e., carrier frequency + or − local oscillator frequency provides a desired signal and an image signal whose bandwidths overlap to a significant degree.

Figure 6:
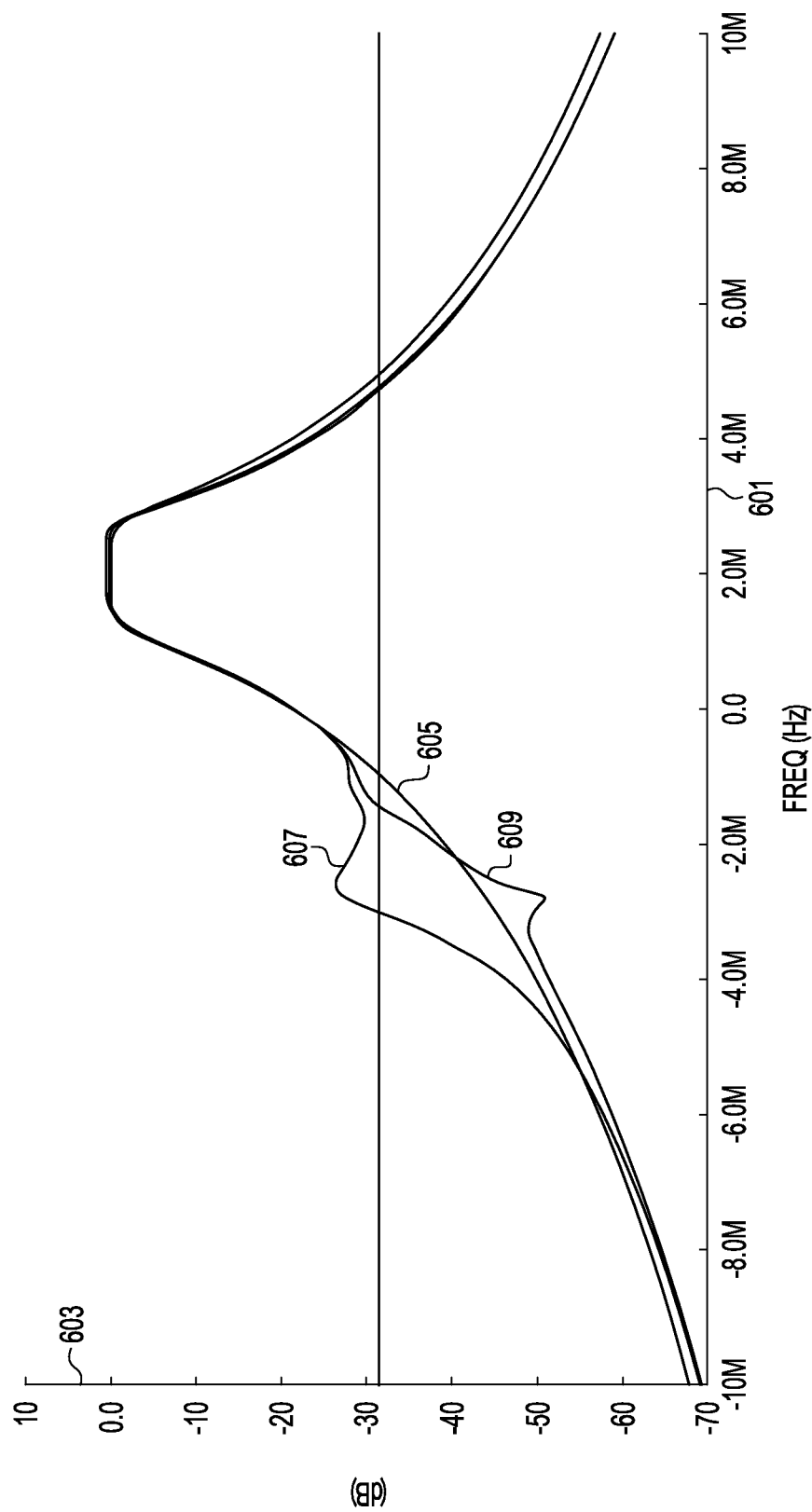
FIG. 6 illustrates various simulated performance data for an image rejection system in accordance with one or more embodiments.

For example a 2.0 MHz bandwidth signal centered at an IF frequency of 2.0 MHz, i.e., signal extends from 1.0 MHz to 3.0 MHz with significant energy extending into the tails or over a broader bandwidth, will have an image signal at −2.0 MHz with a bandwidth extending from −3.0 MHz to −1.0 MHz and more as generally reflected in FIG. 6. Since the signal bandwidth and the undesired image signal overlap, conventional filtering is not possible or at least not practical. Thus practitioners use complex or quadrature mixers 107 followed by a complex or polyphase filter to eliminate (in theory) or minimize (in practice) the amount or degree of image signal that is present. This may be referred to as image rejection. Unfortunately the sensitivity of this image signal or amount thereof to mismatch is relatively high, e.g., a small % mismatch in the mixer 107 can result in an image signal only 25 dB below the desired signal.

Further included in the system 101 is the polyphase filter 103 which is coupled to the I and Q signal at 109, 111 respectively. The polyphase filter as known generally operates to take a complex signal, I and Q, and to combine the components of that signal into a single signal at the output 112. The system or specifically polyphase filter 103 includes a first gm-C filter 113 with first variable biasing 115 (e.g., bias current) coupled to the I signal and a second gm-C filter 117 with second variable biasing 119 (e.g., bias current) coupled to the Q signal. The gm-C or Gm-C (transconductance capacitor) filters are known. The gm or Gm cell essentially is an amplifier which converts a voltage into a current, i.e., a current source with high output impedance. FIG. 1 provides a representative view of the gm-C filters where a much more detailed view of one embodiment of a polyphase and of gm-C filters is provided in FIG. 2. Each of the gm stages or cells has a bias input and these bias inputs are normally used to control the gm cells for the first and the second gm-C filter such that their gm values are very closely matched and such that these gm values are compensated for differences or changes due to process, supply voltage, and temperature variables or variations.

Additionally shown in FIG. 1 is a bias controller 121 coupled to the polyphase filter 103, specifically the first gm-C filter 113 via the variable bias 115 and additionally coupled to the second gm-C filter 117 via the variable bias 119. The bias controller is advantageously arranged and configured to offset the first variable biasing and a corresponding first gm of the first gm-C filter 113 relative to the second variable biasing and a corresponding gm of the second gm-C filter 117 and thereby improve or enhance image rejection in the system. Thus the bias controller 121 purposely makes one or more gm values in the first gm-C filter 113 different from the corresponding one or more gm values in the second gm-C filter 117 and thereby cancels or rejects an image signal that is present at the input to the polyphase filter 103 due to, e.g., imperfections or imbalances in the mixer 107.

It has been found by simulations and the like that, when the bias controller 121 is configured to offset the first variable biasing and corresponding first gm of the first gm-C filter 113 relative to the second variable biasing and corresponding second gm of the second gm-C filter 117 by an offset or offset amount in a range from less than about 1% to about 20% or more, significant improvements in image rejection can be observed. As will be further discussed with reference to FIG. 2, when the bias controller 121 is further configured to offset the first variable biasing and corresponding first gm of the first gm-C filter 113 relative to the second variable biasing and corresponding second gm of the second gm-C filter 117 and thereby or by doing so to vary a gain through the first gm-C filter 113 relative to a gain through the second gm-C filter 117, image rejection can be improved. Similarly or in other instances when the bias controller 121 is configured to offset the first variable biasing and corresponding first gm or other gm of the first gm-C filter 113 relative to the second variable biasing and corresponding second gm or other gm of the second gm-C filter 117 and thereby vary a phase shift through the first gm-C filter 113 or portion thereof relative to a phase shift through the second gm-C filter 117 or portion thereof, image rejection can also be improved. In still further embodiments when the bias controller 121 is configured to offset a first variable biasing current and corresponding first one or more gms of the first gm-C filter 113 relative to a second variable biasing current and corresponding second one or more gms of the second gm-C filter 117 and thereby offset a gain and a phase shift through the first gm-C filter 113 relative to a gain and a phase shift through the second gm-C filter 117, image rejection can be improved.

Figure 2:
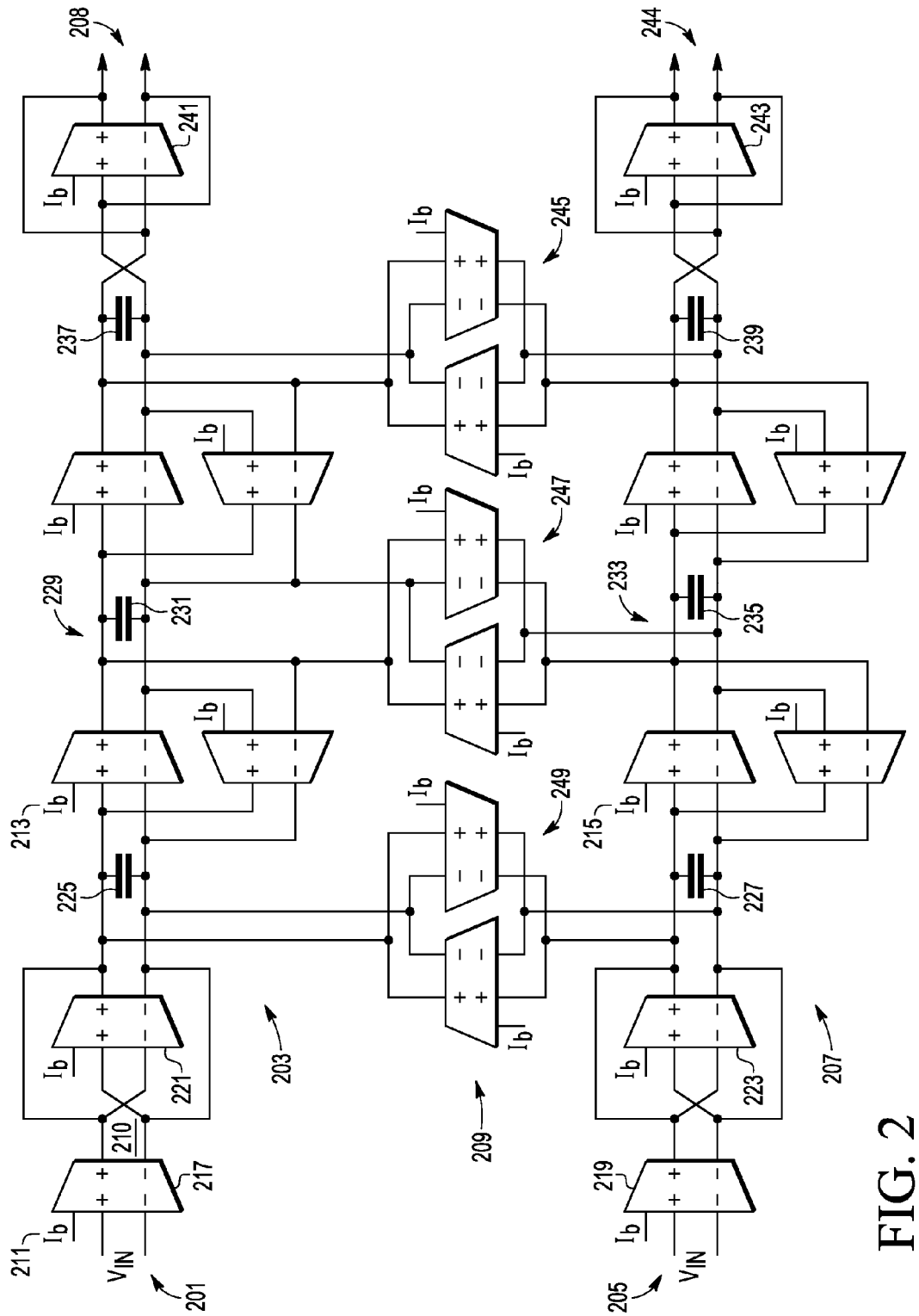
FIG. 2 in a representative form, shows a more detailed diagram of a polyphase gm-C filter suitable for use in the system of FIG. 1 in accordance with one or more embodiments.

In more detailed embodiments, e.g., FIG. 2, wherein the first gm-C filter 113 comprises a first multiplicity of gm-C stages and the second gm-C filter 117 comprises a second multiplicity of gm-C stages, wherein the first gm-C filter 113 is cross coupled to the second gm-C filter 117 with one or more additional gm stages, wherein a multiplicity of the gm and gm-C stages have corresponding variable biasing, and wherein the bias controller 121 is configured to offset a corresponding bias current for each of a plurality of the first multiplicity of gm-C stages relative to a corresponding bias current for each of a plurality of the second multiplicity of gm-C stage, image signals can be reduced or image rejection can be enhanced or improved.

As noted above, the system 101 in some instances comprises a quadrature mixer, e.g., mixer 107, arranged for providing an in phase and a quadrature signal wherein the in phase signal is coupled to the first gm-C filter 113 and the quadrature signal is coupled to the second gm-C filter 117, and wherein the bias controller 121 offsets a bias current, e.g., bias 115, for one or more gm stages in the first gm-C filter 113 relative to a bias current, e.g., bias 119, for one or more gm stages in the second gm-C filter 117 to reduce a signal level or ratio at an image frequency at an output of the polyphase filter relative to that signal level or ratio at an input to the polyphase filter. Further, in many embodiments, the bias controller 121 is additionally configured to set and control the first variable biasing for the first gm-C filter 113 and the second variable biasing for the second gm-C filter 117 to provide compensation for process, voltage, and temperature variations (pvt compensation) and wherein offsetting the first variable biasing relative to the second variable biasing is superimposed on this compensation. In essence, the compensation is provided by the bias controller 121 responsive to a reference 123, where the reference is a signal that varies in accordance with the variation or variables related to process, voltage, and temperature. Ordinarily this compensation sets gms in the first gm-C filter 113 to be equal to the corresponding gms in the second gm-C filter 117, since all of these gm cells will be subject to nearly the same process, voltage, and temperature variables. This reference can be provided by various known approaches. As will be discussed with reference to FIG. 4, the bias controller 121 in some embodiments is configured to offset the first variable biasing relative to the second variable biasing and thus is further configured to change a bias current in a gm cell, the gm cell including linearization and common mode rejection circuitry.

As further illustrated in FIG. 1, some embodiments of the system comprises an apparatus or circuitry 125, coupled to the output at 112 of the polyphase filter 103 for determining image power of a signal at the output and an analog to digital convertor (ADC) 127 for providing a digital representation of the image power to the bias controller. As will be further discussed and described below, the bias controller 121 responsive to the representation of the image power from the ADC will operate to offset and mismatch one or more of various of the gm cell biases in order to minimize the image power, i.e., improve or enhance the image rejection of the polyphase filter 103.

Referring to FIG. 2, a representative and more detailed diagram of a polyphase gm-C filter suitable for use in the system of FIG. 1 in accordance with one or more embodiments is illustrated. This polyphase gm-C filter is suitable for use in the system of FIG. 1 and will be briefly discussed and described below. FIG. 2 shows one embodiment of a gm-C polyphase filter, where a first input 201 is coupled to an in-phase signal, e.g., the signal at 109, and this signal is processed by a first gm-C filter 203, such as the first gm-C filter 113, and where a second input 205 is coupled to a quadrature signal, e.g., the signal at 111, and this signal is processed by a second gm-C filter 207, such as the second gm-C filter 117. The in-phase and quadrature signals are filtered and combined into a single in-phase signal at output 208.

FIG. 2 illustrates a multiplicity of gm cells as trapezoidal figures with inputs on the long side and outputs on the parallel short side, which are shown in a differential version (positive "+" and negative "−" input pins (see $V_I$ 201, $V_q$ 205, etc) and positive "+" and negative "−" output pins 208, 210. Each of the trapezoidal figures or gm cells is shown with a bias current, $I_b$ 211. Although only a few gm cell are explicitly shown with $I_b$ labeled with a reference number, it will be appreciated that each gm cell has a bias current and that these may vary from each other within a given filter. As will be further appreciated in normal filters, ordinary design and pvt compensation techniques would result in the bias current for a given gm cell in one filter being equal to the corresponding and analogous bias current in the other filter, e.g., $I_b$ 213=$I_b$ 215, etc.

The first gm-C filter 203 comprises a first multiplicity of gm-C stages as shown along the upper horizontal of FIG. 2 and the second gm-C filter 207 comprises a second multiplicity of gm-C stages as shown along the bottom horizontal of FIG. 2. Furthermore, the first gm-C filter 203 is cross coupled to the second gm-C filter 207 with one or more additional gm stages 209 as shown along the middle horizontal of FIG. 2. As noted above a multiplicity of the gm and gm-C stages have corresponding variable biasing as reflected with the $I_b$ in the upper input corner (near positive input) of each gm cell (e.g., $I_b$ 211). As will be further discussed below, the bias controller 121 is configured to offset or mismatch (cause to be different from each other) a corresponding bias current for each of a plurality (may not be all) of the first multiplicity of gm-C stages relative to a corresponding bias current for each of a plurality of the second multiplicity of gm-C stages.

Polyphase filter architectures or topologies are known and one approach for realizing a polyphase filter is the use of gm cells as reflected in FIG. 2. While the topology is generally known, a brief review may be useful. At the input to each gm-C filter 203, 207, is a buffer 217, 219, respectively, and the gain of these buffers is proportional to gm for the respective cell and this gm is controlled by $I_b$ for the respective gm cell. The buffers 217, 219 are coupled to gm cells 221, 223 which, as cross coupled, are or act as respective resistors with values inversely proportional to their respective gm and thus $I_b$. The resistors, gm cells 221, 223, are coupled to capacitors 225, 227 that can be realized in various known manners (e.g., metal insulator metal capacitors taking advantage of existing layers in the integrated circuit structure).

The capacitors are across the inputs to respective gyrators 229, 233 and their capacitors 231, 235. The gyrators 229, 233 (four gm cells arranged as shown with a capacitor) act or operate as inductors with an inductance proportional to their respective $C/gm^2$ and thus respective $I_b$, where C is the capacitance of the capacitor and the gm is a combination of the four gms. In practice these gms are all equal so the combination is simply gm. The gyrators 229, 233 are coupled to, respective capacitors 237, 239 and from there to output resistors 241, 243 (gm cells arranged as resistors). Basically each gm-C filter 203, 207 as shown is a known 3 pole Butterworth filter centered at 2.0 MHz with a 2.0 MHz bandwidth. Note that the output, if available, at 244 is equal to the output at 208.

Additionally, cross coupling gm cells 245, 247, 249 are coupled across respective capacitors 237 & 239, 231 & 235, 225 & 227. As is known, the cross coupled gm cells 245, 247, 249 set the center frequency of the filter and operate to combine the in-phase and quadrature input signals. It has been experimentally determined via simulations that image signals at the inputs 201, 205, in some embodiments, can be rejected in the polyphase filter by mismatching the bias currents and thus gms and gains for gm cells 217, 219. It has further been found that image signals at the inputs 201, 205 in some embodiments can be rejected in the polyphase filter by mismatching gms in one or more of the cross coupled gm cells 245, 247, 249 or other gm cells and thus gains or phases in the respective gm-C filters.

Figure 3:
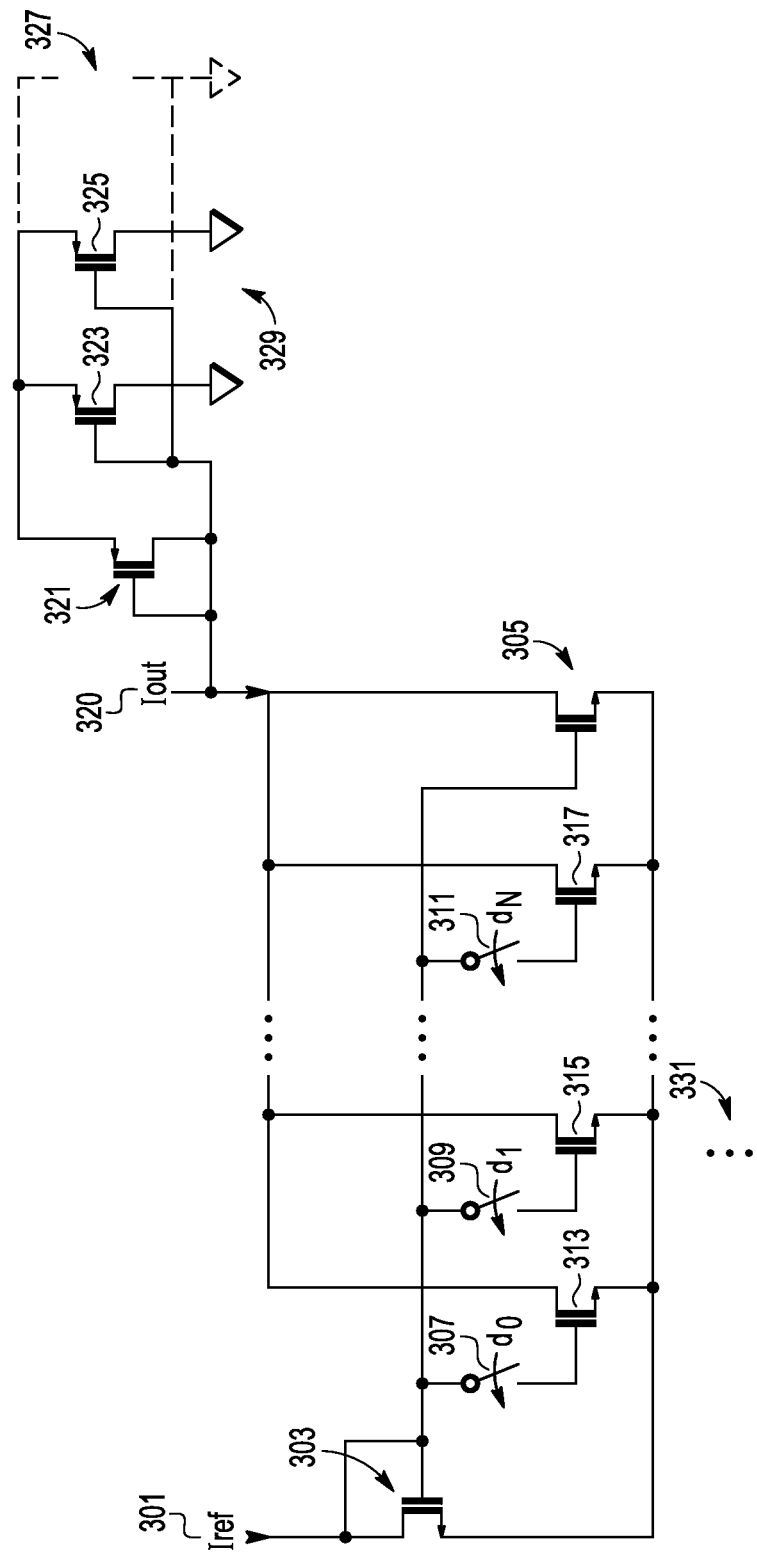
FIG. 3 depicts in a representative form a portion of a bias controller in accordance with one or more embodiments.

Referring to FIG. 3, a representative diagram of a portion of a bias controller, e.g., bias controller 121, in accordance with one or more embodiments will be discussed and described. FIG. 3 shows one instance of an embodiment that will be repeated in one or more forms for each bias current, $I_b$, in the filter of FIG. 2. In FIG. 3 a reference current, $I_{ref}$ 301 (such as ref 123 or some proportion thereof in FIG. 1) supplies and drives a current source 303 with $I_{ref}$ 301, i.e., the drain to source current in 303 is $I_{ref}$ 301. This current $I_{ref}$ 301, will be mirrored in current source 305, i.e., current source 305 will have a drain to source current that equals the current in 303, assuming that device geometries or features are equal.

Control signals d0, d1, . . . dn 307, 309 . . . 311 selectively control or enable additional current sources 313, 315, . . . , 317 that are coupled in parallel with current source 305 and thus, when enabled, will mirror proportionately the current through current source 303. Control signals d0, d1, . . . dn 307, 309 . . . 311 and additional current sources 313, 315 . . . 317 form a digital to analog converter (DAC). Control signals d0, d1, . . . dn 307, 309, . . . , 311 are provided by an ADC (e.g., ADC 127). The parallel coupled current sources 313, 315 . . . 317 are arranged and configured such that the minimum change desired (resolution of the DAC) is obtained by enabling one current source, e.g., current source 313, with current source 315 providing twice the current as current source 313. The different current sources are realized by sizing the features of the MOS transistors in proportion to the current desired. In one embodiment, a 6 bit DAC is implemented, i.e., there are six control lines from the ADC selectively controlling 6 parallel current sources where, for example, the smallest current source, e.g. current source 313 switches about 0.15 micro amps and the largest current source, e.g., current source 317 switches about 4.8 micro amps, while current sources 303 and 305 nominally conduct about 1.2 micro amps. In the above example, the MOS transistor used in current source 313 should have features that are approximately 10% the size of the features of the MOS transistor used in current source 305. The features of the MOS transistor used in current source 315 should be approximately twice the size of the features of the MOS transistor used in current source 313, etc.

All of the currents from the mirroring current source 305 and enabled ones of the current sources 313-317 are combined and provided as $I_{out}$ 320 to drive a current source 321. The current through current source 321 is mirrored through one or more current sources 323, 325 . . . 327. Note that outputs 329 from current sources 323, 325, etc. can be used individually as a bias current or can be coupled together and used as a bias current for a gm cell in the filter of FIG. 2. The FIG. 3 circuitry in varying forms can be duplicated as required as indicated at 331. In one embodiment, the current in current source 321 is mirrored by one current source, e.g., current source 323. In that embodiment the circuits of FIG. 3 or specifically the resultant circuit architectures are repeated four times, to provide bias to each input resistor 221, 223 and each output resistor 241, 243, although it will be noted that the bias currents to each resistor may vary each to the other.

In one embodiment the current in current source 321 is mirrored by two current sources 323, 325. In this case the circuits of FIG. 3 are repeated twice, one time to provide bias to the input buffer 217 and again to provide bias current to the input buffer 219. The two output currents from one of the circuits are used to bias buffers 217 and the two outputs from the second circuit are used to bias buffer 219. In one or more embodiments, the current in current source 321 is mirrored by four current sources 323, 325 . . . 327. The four output currents are used to bias each gm-Cell in gyrator 229 and gyrator 233. Additionally the four currents are used two at a time to bias the gm cells in cross coupling gm cell 245, 249. Thus the circuitry of FIG. 3 with four current outputs from four current sources 323, 325 . . . 327 is repeated four times. In one or more embodiments, the current in current source 321 is mirrored by eight current sources 323, 325 . . . 327. In this instance four of these currents can be used to bias one of the gm cells with the other four used to bias the other gm cell in the cross coupled gm cells 247. Thus in one embodiment of the filter of FIG. 2, the circuitry of FIG. 3 is repeated 331 in varying versions eleven different times to provide a bias current to each of the gm cells in the polyphase filter of FIG. 2. Furthermore as has been shown and discussed, the bias current will depend on the reference, $I_{ref}$ as well as the signal from the ADC 127, which reflects or is a representation of the image power.

Figure 4:
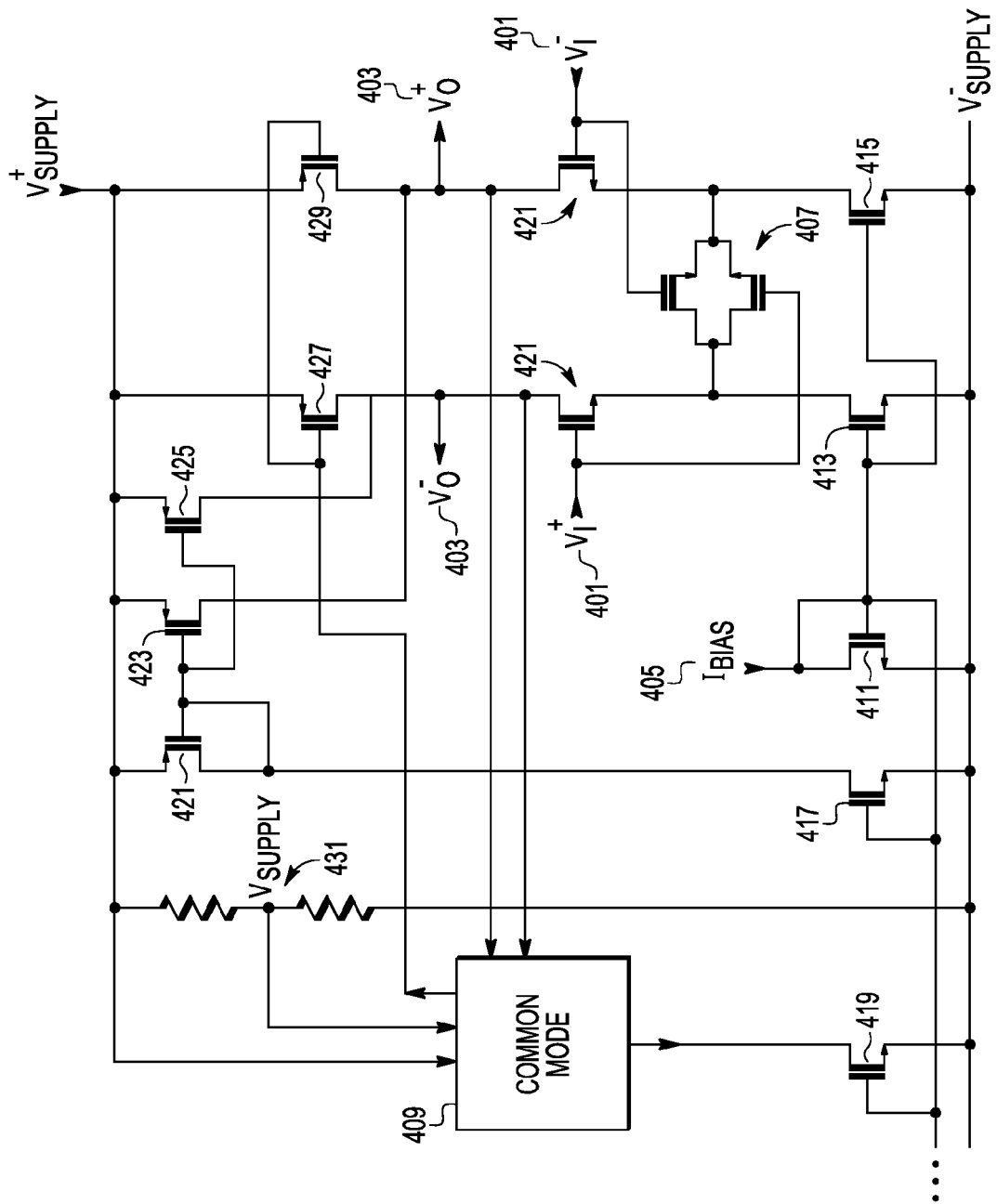
FIG. 4 depicts in a representative form a gm cell suitable for use in the FIG. 2 polyphase filter in accordance with one or more embodiments.

Referring to FIG. 4, a representative diagram of a gm cell suitable for use in the FIG. 2 polyphase filter in accordance with one or more embodiments will be discussed and described. FIG. 4 as will be discussed, shows a gm cell 400 with differential inputs, Vi+, Vi−, 401 and differential outputs, Vo+, Vo−, 403 and bias input, $I_{bias}$ 405, the gm cell further including linearization circuitry 407 and common mode rejection circuitry 409. The bias current, $I_{bias}$ 405, can be provided by one or more of the outputs 329 as shown in FIG. 3 and thus this bias current would vary in accordance with a pvt compensation reference level, $I_{ref}$ 301 and ADC output d0, d1, . . . , dn 307, 309, 311. The bias current 405 drives a current source 411 and the current through this source is mirrored proportionally by current sources 413, 415, 417, and 419.

Current sources 413, 415 provide a bias current to input stages 421, and in one embodiment, this bias current is twice the input bias current, (e.g., 5 micro amps through 411 results in 10 micro amps through each of 413, 415). Current source 417 mirrors the current in current source 411, and the current through 417 drives a current source 421, which is mirrored by current sources 423, 425. The current through current sources 423, 425 provides approximately 50% of the bias current through input stages 421 with the balance coming from current sources 427, 429, which are mirroring a current source (not specifically shown) in the common mode rejection circuitry 409. The common mode rejection circuitry 409 is biased by current source 419 and operates to provide a nominal (e.g., 5 micro amp) current through each of current sources 427, 429. The common mode circuitry 409 uses a common mode reference which is provided by a resistive divider 431. Also the output signals are inputs to the common mode circuitry 409. The common mode circuitry 409 is a combination of amplifiers that operate to sense and control any common mode signal on the output signal 401.

Figure 5:
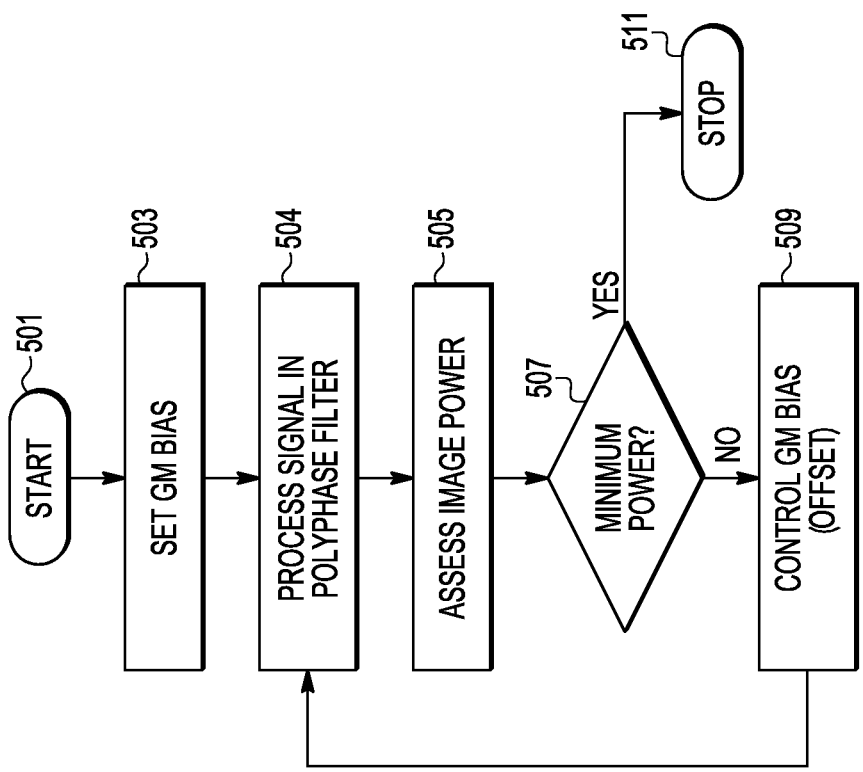
FIG. 5 shows a flow chart of processes executed by a method of image rejection in accordance with one or more embodiments.

Referring to FIG. 5, a simplified and representative flow chart of processes executed by a method of image rejection in accordance with one or more embodiments will be discussed and described. It will be appreciated that this method uses many of the inventive concepts and principles discussed in detail above and thus this description will be somewhat in the nature of a summary with various details generally available in the earlier descriptions. This method can be implemented in one or more of the structures or apparatus described earlier or other similarly configured and arranged structures.

The process flow depicted in FIG. 5 starts 501 and follows with setting gm biasing 503 for filters, etc. This can be done as discussed above using the reference signal or reference bias and the bias controller which accounts for process, voltage, and temperature variables. Then the signal at 109, 111 is processed in a complex polyphase filter 504, such as the filter of FIG. 2. Note that the signal at 109, 111 can be a signal provided to the complex mixer in a test mode, e.g., a synthesized signal, such as a pure carrier. An in phase portion of the signal is coupled to a first gm-C filter 113 including at least a first gm-C filter configured with variable biasing and a quadrature portion of the signal is coupled to a second gm-C filter 117 including at least a second gm-C filter configured with variable biasing. The image power is then assessed 505 at the output of the polyphase filter using filters, etc. as is known.

Next it is decided or determined whether the image power is a minimum 507. Note that the first time through the process the answer to this question must be NO as there is nothing to compare it to. Then gm bias is controlled by varying gm offsets 509. More specifically, controlling gm bias 509 in some embodiments includes controlling, using a bias controller coupled to the first gm-C filter stage and the second gm-C filter stage, the biasing of the first gm-C filter stage relative to the second gm-C filter stage to provide a mismatched gm and thereby improve rejection of the image signal. After an adjustment to gm offset in one or more gm cells, the signal is again processed 504, image power is assessed 505, and a comparison is made to determine whether a minimum has been found 507. If the image signal is larger, then the previous adjustment was in the wrong direction and something else should be tried, including possibly reverting to the previous gm settings.

As noted previously small changes can provide significant improvement, e.g., the controlling can comprise offsetting the first variable biasing and a corresponding first gm of the first gm-C filter relative to the second variable biasing and a corresponding second gm of the second gm-C filter by less than about 1% and up to as much as about 20% or more. In some embodiments, the controlling further comprises offsetting the first variable biasing and a corresponding first gm of the first gm-C filter relative to the second variable biasing and a corresponding second gm of the second gm-C filter, thus causing a difference in a gain through the first gm-C filter relative to a gain through the second gm-C filter. This could be done by offsetting the gm of the buffers 217, 219 in FIG. 2. This could continue until the image power no longer decreases.

In still other embodiments, the controlling further comprises offsetting the first variable biasing and a corresponding first gm of the first gm-C filter relative to the second variable biasing and a corresponding second gm of the second gm-C filter, thus causing or yielding a difference in a phase shift through the first gm-C filter relative to a phase shift through the second gm-C filter. This can be done by offsetting the gms of the gm cells in cross coupling gm stages 247, 249, or 245, etc. This can continue until image power stops decreasing. Note also that the initial attempt might be in the wrong direction and would thus need to be corrected and then changed in the opposite direction, by repeating processes 504, 505, 507, and 509. In yet other embodiments and possibly in most instances, the controlling further comprises offsetting a first variable biasing current and a corresponding first gm of the first gm-C filter relative to a second variable biasing current and a corresponding second gm of the second gm-C filter thus causing a difference between a gain and a phase shift through the first gm-C filter relative to a gain and a phase shift through the second gm-C filter. In most instances a change in gain as well as phase may be indicated to improve image rejection.

As is evident from above, the first gm-C filter often comprises a first multiplicity of gm-C stages and the second gm-C filter often comprises a second multiplicity of gm-C stages, wherein the first gm-C filter is cross coupled to the second gm-C filter with one or more additional gm stages, wherein a multiplicity of the gm and gm-C stages have corresponding variable biasing, and in these instances the controlling further comprises causing a difference between a corresponding bias current for each of a plurality of the first multiplicity of gm-C stages relative to a corresponding bias current for each of a plurality of the second multiplicity of gm-C stages. Setting the gm bias 503 to obtain proper performance gains, etc. and compensation can be part of the controlling, the controlling further comprising setting and controlling the first variable biasing for the first gm-C filter and the second variable biasing for the second gm-C filter to provide compensation for process, voltage, and temperature variations and wherein controlling 509 the first variable biasing relative to the second variable biasing to provide a mismatched gm is superimposed on the biasing and compensation activities of process 503. In some embodiments, the controlling 509 further comprises offsetting the first variable biasing relative to the second variable biasing to change a bias current in a gm cell, the gm cell including linearization and common mode rejection circuitry as in FIG. 4. As noted above and shown in FIG. 5 the method further comprises determining image power and the controlling is responsive to the image power.

While FIG. 5 indicates minimum power at process 507, some embodiments only require a value that is sufficiently low at process 507, e.g, 30 dB ratio. It will be appreciated that the processes illustrated by FIG. 5 and those discussed above can be repeated as often as needed.

FIG. 6 illustrates various simulated performance data for an image rejection system in accordance with one or more embodiments. In FIG. 6, frequency is shown on the horizontal axis 601 with relative amplitudes on the vertical axis 603. Further shown is an ideal signal spectrum 605 with a pass band centered at 2 MHz with a signal bandwidth extending from approximately 1 MHz to 3 MHz. Additionally depicted is a signal spectrum without the present invention, mpre specifically non-mismatched gm trace 607 showing an image signal that peaks at approximately 25 dB down. This signal was obtained with a 5% mismatch between the I and Q signal phases, i.e., 85 degrees rather than 90 degrees. Further shown is a signal spectrum 609 using the offset or mismatched gms, which spectrum shows a reduction in image power of approximately 50 dB or as much as 25 dB improvement over the non-mismatched trace 607.

It will be appreciated that the above described functions and structures may be implemented in one or more integrated circuits. For example, many or all of the functions can be implemented in one integrated circuit as suggested by FIG. 1 or the mixers and filtering can be in on IC with any assessment or computations and control algorithms implemented in a separate controller or processor based IC.

The processes, apparatus, and systems, discussed above, and the inventive principles thereof are intended to and can alleviate image signal issues or insufficient image rejection issues caused by prior art techniques. Using the principles of offsetting or mismatching gms in a polyphase filter given an assumption that most of the image signal problem is caused by an imbalance in the mixers can quickly yield an accurately tuned filter for image rejection with relatively minimal costs and the like.

An embodiment of a system that includes a polyphase filter includes a first gm-C filter with first variable biasing, a second gm-C filter with second variable biasing, and a bias controller coupled to the first gm-C filter and the second gm-C filter. The bias controller is configured to offset the first variable biasing and a corresponding first gm of the first gm-C filter relative to the second variable biasing and a corresponding second gm of the second gm-C filter to thereby improve image rejection in the system.

An embodiment of a method for rejecting an image signal includes processing a signal in a complex polyphase filter. An in phase portion of the signal is coupled to a first gm-C filter including at least a first gm-C filter configured with variable biasing. A quadrature portion of the signal is coupled to a second gm-C filter including at least a second gm-C filter configured with variable biasing. The method further includes controlling, using a bias controller coupled to the first gm-C filter stage and the second gm-C filter stage, the biasing of the first gm-C filter stage relative to the second gm-C filter stage to provide a mismatched gm and thereby improve rejection of the image signal.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A system that includes a polyphase filter, the system comprising:

a first gm-C filter with first variable biasing;

a second gm-C filter with second variable biasing; and
a bias controller coupled to the first gm-C filter and the second gm-C filter and configured to offset the first variable biasing and a corresponding first gm of the first gm-C filter relative to the second variable biasing and a corresponding second gm of the second gm-C filter to thereby improve image rejection in the system,
wherein the bias controller is further configured to change a bias current in a gm cell, the gm cell including linearization circuitry.

2. The system of claim 1 wherein the bias controller is further configured to offset the first variable biasing and corresponding first gm of the first gm-C filter relative to the second variable biasing and corresponding second gm of the second gm-C filter by 1% or more.

3. The system of claim 1 wherein the bias controller is further configured to offset the first variable biasing and a corresponding first plurality of gms of the first gm-C filter relative to the second variable biasing and corresponding second plurality of gms of the second gm-C filter and thereby vary a gain through the first gm-C filter relative to a gain through the second gm-C filter.

4. The system of claim 1 wherein the bias controller is further configured to offset the first variable biasing and corresponding first gm of the first gm-C filter relative to the second variable biasing and corresponding second gm of the second gm-C filter and thereby vary a phase shift through the first gm-C filter relative to a phase shift through the second gm-C filter.

5. The system of claim 1 wherein the bias controller is further configured to offset a first variable biasing current and corresponding first gm of the first gm-C filter relative to a second variable biasing current and corresponding second gm of the second gm-C filter and thereby offset a gain and a phase shift through the first gm-C filter relative to a gain and a phase shift through the second gm-C filter.

6. The system of claim 1 wherein the first gm-C filter comprises a first multiplicity of gm-C stages and the second gm-C filter comprises a second multiplicity of gm-C stages, wherein the first gm-C filter is cross coupled to the second gm-C filter with one or more additional gm stages, wherein a multiplicity of the gm and gm-C stages have corresponding variable biasing, and wherein the bias controller is configured to offset a corresponding bias current for each of a plurality of the first multiplicity of gm-C stages relative to a corresponding bias current for each of a plurality of the second multiplicity of gm-C stages.

7. The system of claim 1 further comprising a quadrature mixer providing an in phase and a quadrature signal wherein the in phase signal is coupled to the first gm-C filter and the quadrature signal is coupled to the second gm-C filter, and wherein the bias controller offsets a bias current for one or more gm stages in the first gm-C filter relative to a bias current for one or more gm stages in the second gm-C filter to reduce a signal level at an image frequency at an output of the polyphase filter relative to that signal level at an input to the polyphase filter.

8. The system of claim 1 wherein the bias controller is further configured to set and control the first variable biasing for the first gm-C filter and the second variable biasing for the second gm-C filter to provide compensation for process, voltage, and temperature variations and wherein offsetting the first variable biasing relative to the second variable biasing is superimposed on the compensation.

9. The system of claim 1 wherein the gm cell further includes common mode rejection circuitry.

10. The system of claim 1 further comprising an apparatus, coupled to the output of the polyphase filter for determining image power, and an analog to digital convertor for providing a digital representation of the image power to the bias controller.

11. A method for rejecting an image signal, the method comprising:
processing a signal including the image signal in a complex polyphase filter;
wherein an in phase portion of the signal is coupled to a first gm-C filter including at least a first gm-C filter stage configured with first variable biasing; and
wherein a quadrature portion of the signal is coupled to a second gm-C filter including at least a second gm-C filter stage configured with a second-variable biasing; and
controlling, using a bias controller coupled to the first gm-C filter stage and the second gm-C filter stage, the first variable biasing of the first gm-C filter stage relative to the second variable biasing of the second gm-C filter stage to provide a mismatched gm for one or more gms in the first gm-C filter relative to one or more gms in the second gm-C filter and thereby improve rejection of the image signal,
wherein the controlling further comprises offsetting the first variable biasing relative to the second variable biasing to change a bias current in a gm cell, the gm cell including common mode rejection circuitry.

12. The method of claim 11 wherein the controlling further comprises offsetting the first variable biasing and a corresponding first gm of the first gm-C filter relative to the second variable biasing and a corresponding second gm of the second gm-C filter by 1% or more.

13. The method of claim 11 wherein the controlling further comprises offsetting the first variable biasing and a corresponding first plurality of gms of the first gm-C filter relative to the second variable biasing and a corresponding second plurality of gms of the second gm-C filter thus causing a difference in a gain through the first gm-C filter relative to a gain through the second gm-C filter.

14. The method of claim 11 wherein the controlling further comprises offsetting the first variable biasing and a corresponding first gm of the first gm-C filter relative to the second variable biasing and a corresponding second gm of the second gm-C filter thus causing a difference in a phase shift through the first gm-C filter relative to a phase shift through the second gm-C filter.

15. The method of claim 11 wherein the controlling further comprises offsetting a first variable biasing current and a corresponding first gm of the first gm-C filter relative to a second variable biasing current and a corresponding second gm of the second gm-C filter thus causing a difference between a gain and a phase shift through the first gm-C filter relative to a gain and a phase shift through the second gm-C filter.

16. The method of claim 11 wherein the first gm-C filter comprises a first multiplicity of gm-C stages and the second gm-C filter comprises a second multiplicity of gm-C stages, wherein the first gm-C filter is cross coupled to the second gm-C filter with one or more additional gm stages, wherein a multiplicity of the gm and gm-C stages have corresponding variable biasing, and wherein the controlling further comprises causing a difference between a corresponding bias current for each of a plurality of the first multiplicity of gm-C stages relative to a corresponding bias current for each of a plurality of the second multiplicity of gm-C stages.

17. The method of claim 11 wherein the processing a signal further comprises processing a signal from a quadrature mixer that includes the in phase portion and the quadrature portion, and wherein the controlling further comprises offsetting a bias for one or more gm stages in the first gm-C filter relative to a bias for one or more gm stages in the second gm-C filter to reduce a signal level at an image frequency at an output of the polyphase filter relative to a signal level at an input to the polyphase filter.

18. The method of claim 11 wherein the controlling further comprises setting and controlling the first variable biasing for the first gm-C filter and the second variable biasing for the second gm-C filter to provide compensation for process, voltage, and temperature variations and wherein controlling the first variable biasing relative to the second variable biasing to provide a mismatched gm is superimposed on the compensation.

19. The method of claim 11 wherein the gm cell further includes linearization circuitry.

20. The method of claim 11 further comprising determining image power and wherein the controlling is responsive to the image power.

\* \* \* \* \*